US012721117B2

(12) United States Patent
Li et al.

(10) Patent No.: US 12,721,117 B2
(45) Date of Patent: Aug. 25, 2026

(54) IN SITU ETCH RATE DIFFERENTIATION THROUGH OXIDATION

(71) Applicant: Tokyo Electron Limited, Tokyo (JP)

(72) Inventors: Na Li, Albany, NY (US); Jason Marion, Albany, NY (US); Yun Han, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 18/601,185

(22) Filed: Mar. 11, 2024

(65) Prior Publication Data

US 2025/0285911 A1 Sep. 11, 2025

(51) Int. Cl.

| | |
|---|---|
| ***H10W 10/00*** | (2026.01) |
| ***H01J 37/32*** | (2006.01) |
| ***H10P 50/00*** | (2026.01) |
| ***H10P 50/28*** | (2026.01) |
| ***H10P 76/40*** | (2026.01) |
| ***H10W 10/17*** | (2026.01) |

(52) U.S. Cl.

CPC ..... *H10W 10/014* (2026.01); *H01J 37/32449* (2013.01); *H10P 50/283* (2026.01); *H10P 50/73* (2026.01); *H10P 76/405* (2026.01); *H10P 76/4085* (2026.01); *H10W 10/17* (2026.01); *H01J 2237/3341* (2013.01)

(58) Field of Classification Search

None

See application file for complete search history.

(56) References Cited

U.S. PATENT DOCUMENTS

| | | | | |
|---|---|---|---|---|
| 2008/0057729 | A1* | 3/2008 | Shen | H10P 50/268 438/735 |
| 2022/0243330 | A1* | 8/2022 | Kim | C23C 16/402 |
| 2023/0268189 | A1* | 8/2023 | Musselwhite | H10P 50/283 |

* cited by examiner

*Primary Examiner* — Shamim Ahmed
(74) *Attorney, Agent, or Firm* — Slater Matsil, LLP

(57) ABSTRACT

A method of etching a target material exposed on a substrate that also includes a reservation material exposed on the substrate includes exposing both the target material and the reservation material to an oxygen source to selectively form oxide on the reservation material relative to the target material, and etching the target material using an etchant gas. The oxide on the reservation material slows an effective etch rate of the reservation material relative to an effective etch rate of the target material. The reservation material may have a similar or different material composition than the target material. The target material may be exposed in a first subset of recesses with a first aspect ratio and while the reservation material may be exposed in a second set of the recesses with a second aspect ratio higher than the first aspect ratio.

16 Claims, 6 Drawing Sheets

IN SITU ETCH RATE DIFFERENTIATION THROUGH OXIDATION

TECHNICAL FIELD

The present invention relates generally to etching processes, and, in particular embodiments, to systems and methods for etching processes that use in situ oxidation to increase the effective etch rate of a target material relative to a reservation material.

BACKGROUND

Microelectronic device fabrication typically involves a series of manufacturing techniques that include formation, patterning, and removal of a number of layers of material on a substrate. Etch masks may be formed (e.g., deposited, grown, patterned) to protect regions of the substrate and allow for pattern transfer via etching. Wet or dry etching processes may be used, with plasma etching processes being an example of a dry etching process. Etching processes are used extensively to form networks of electronic components and interconnect elements (e.g., transistors, resistors, capacitors, metal lines, contacts, and vias) that are integrated as a monolithic structure (i.e., an integrated circuit).

One consideration when etching a target material is the retention of other materials that may come in contact with an etchant during the etching process. Various conditions and materials are chosen to make the etching process as selective as possible to the target material relative to other exposed materials. That is, efforts are made to increase the etch rate of the target material and decrease the etch rate of other exposed materials. The most common materials other than the target material that are also exposed to the etchant are etch masks, which are patterned structures that are formed over the target material to protect regions of the target material while transferring a desired pattern to the target material.

Other materials that are not the target of the etching process may also be exposed to the etchant. Such a material may be referred to as a reservation material (e.g., because the desired outcome during the etching process is to reserve the material rather than remove the material). In some cases, the etching process is selective enough to the target material that no additional action is taken to protect the reservation material from the etchant. However, in other cases an undesirable amount of the reservation material is removed in the amount of time it takes to reach a desired endpoint for the etching of the target material. In these situations, it becomes desirable to provide additional protection for the reservation material.

SUMMARY

In accordance with an embodiment of the invention, a method of etching a target material exposed on a substrate that also includes a reservation material exposed on the substrate includes exposing both the target material and the reservation material to an oxygen source to selectively form oxide on the reservation material relative to the target material, and etching the target material using an etchant gas. The reservation material has a different material composition than the target material. The oxide on the reservation material slows an effective etch rate of the reservation material relative to an effective etch rate of the target material.

In accordance with another embodiment of the invention, a method of etching a target material exposed on a substrate that also includes a reservation material exposed on the substrate includes exposing both the target material and the reservation material to an oxygen source to form oxide both on the target material exposed in a first subset of recesses having a first aspect ratio and on the reservation material exposed in a second set of the recesses having a second aspect ratio higher than the first aspect ratio. The method then includes etching the target material using an etchant gas. The oxide slows an effective etch rate of the reservation material relative to an effective etch rate of the target material.

In accordance with still another embodiment of the invention, a plasma etching system includes a plasma etching chamber configured to contain a plasma, a substrate support configured to support a substrate within the plasma etching chamber, one or more valves configured to fluidically couple an oxygen source gas and an etchant gas to the plasma etching chamber, a source power supply configured to couple source power to the plasma, and a controller operatively coupled to the one or more valves and the source power supply. The substrate includes a target material and a reservation material, both exposed on the substrate. The controller includes a processor and a non-transitory computer-readable medium storing a program including instructions that, when executed by the processor, perform a method in situ in the plasma etching chamber. The method includes exposing both the target material and the reservation material to the oxygen source gas to selectively form oxide on the reservation material relative to the target material, and etching the target material using the etchant gas by applying the source power to generate the plasma. The oxide on the reservation material slows an effective etch rate of the reservation material relative to an effective etch rate of the target material.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
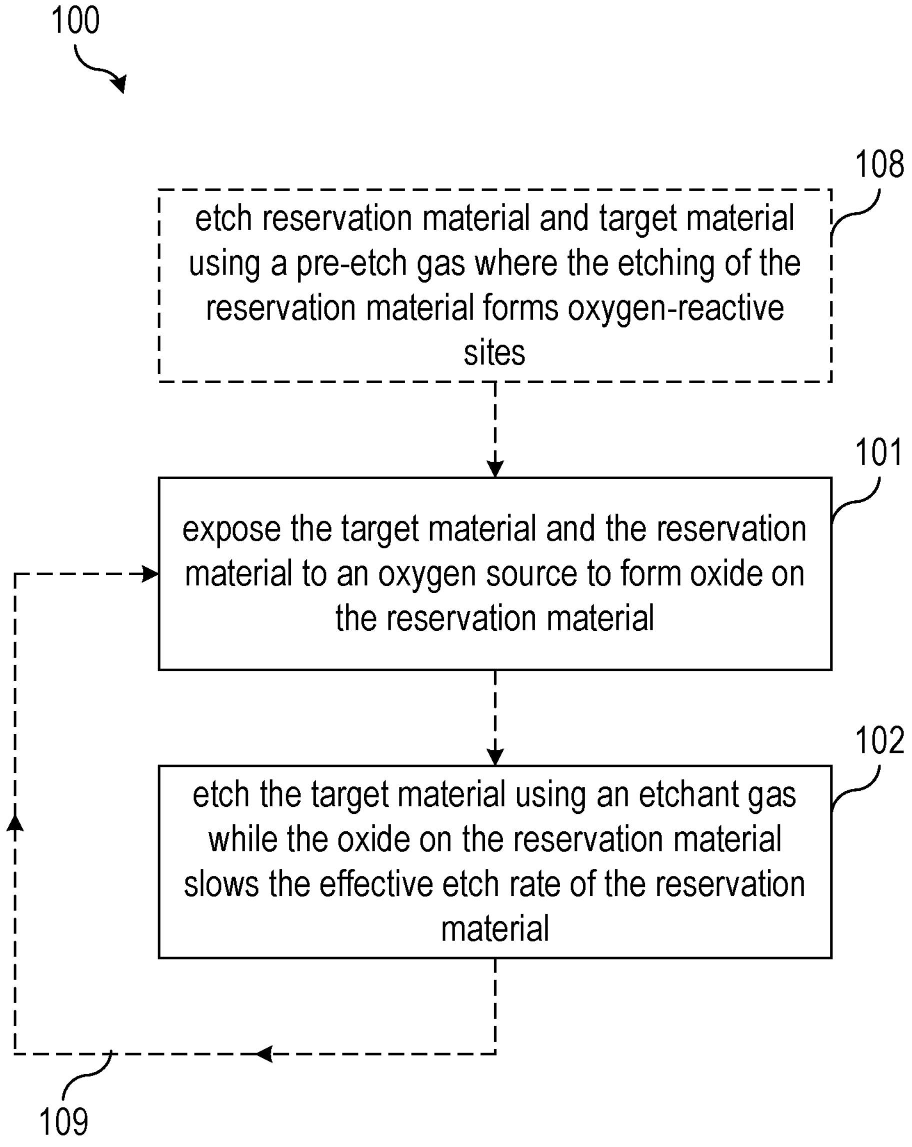
FIG. 1 illustrates an example method of etching a target material using an oxidation step to slow the effective etch rate of a reservation material relative to the effective etch rate of the target material in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

During an etching process, materials other than the target material (i.e., one or more reservation materials) may be exposed to the etchant, such as through openings in an etch mask. This may occur for any number of reasons relating to the complexity of many device structures today. One scenario leading to an exposed reservation material is the use of a single etch mask for two etching processes. For example, the same etch mask may be used to etch the target material after being used to etch an overlying material covering both the target material and a reservation material. If the preceding etch of the overlying material exposes both the target material and the reservation material, then the reservation material will be exposed to the etchant in the subsequent etch.

A specific situation where this may occur is when fabricating three-dimensional devices, such as stacked devices (e.g., transistors, such as field-effect transistors (FETs), one example which are complimentary field-effect transistors (CFETs)). Shallow trench isolation (STI) regions may be formed in a substrate to create substrate regions (e.g., silicon regions between the STI regions) electrically insulated from one another. For example, the substrate regions may define the bottom layer of the stacked devices. A dielectric insulation layer (DIL) may then be formed on the substrate regions to electrically insulate each bottom layer from a respective higher layer of the stack devices. A single mask (e.g., a dielectric mask) may define a pattern with openings that expose the DIL (i.e., the target material of an etching process) and also openings that expose the STI.

In this example, when the DIL is etched, retention of the STI may be a problem. Not only are both the target material (DIL) and the reservation material (STI) exposed by the same mask, but the etching process may not be sufficiently selective to ensure that the devices are electrically insulated from one another by the remaining STI. That is, the DIL and the STI are both dielectric materials, and may even be the same dielectric material, so a significant amount of the STI is undesirably etched when etching the DIL.

One possible solution for decreasing the etch rate of a reservation material (such as an STI) while etching a target material (such as a DIL) is to form a protective structure (i.e., another etch mask) over the reservation material to protect it during the etching process. However, this is not ideal because mask formation steps decrease throughput by adding additional processing steps, often in separate equipment. Yield may also be negatively affected due to increased complexity (e.g., more opportunities for defects) and alignment issues. Another option is to increase the thickness of the reservation material, but this often not possible without disrupting the overall structure (and may be limited or not possible without changing the formation method, as in the case of STI).

Therefore, improved etching processes for etching a target material while retaining a reservation material without additional processing steps or equipment may be desirable.

In accordance with embodiments herein described, the invention proposes a method of etching a target material using an oxidation step to slow the effective etch rate of a reservation material relative to the effective etch rate of the target material. In some embodiments, the difference in composition between the target material and the reservation material is leveraged to selectively form oxide on the reservation material relative to oxide formation, if any, on the target material. In other embodiments, the target material and the reservation material have the same or similar material compositions and a difference in etch rate caused by structure, such as aspect ratio dependent (ARD) etch rates, is utilized to slow the effective etch rate of the reservation material compared to the target material (i.e., even if the effective etch rate of the target material is also slowed by oxide formation, the effective etch rate of the reservation material is slowed more).

In the specific example where the reservation material contains silicon (e.g., silicon oxide in some stoichiometric configuration, such as $SiO_2$), the oxidation step may re-form Si—O bonds from dangling Si bonds to protect the reservation material during a subsequent etch step of the target material. The combination of the oxidation step and the etch step may be repeated as part of a cycle to achieve the desired etch depth of the target material (endpoint of the etching process). For example, during the etch step, the etchant used to etch the target material may break bonds in the reservation material (such as oxygen bonds). Each oxidation step adds oxide to the reservation material (e.g., replenishes oxygen lost during the etch step).

The embodiment etching processes described herein may have various advantages over conventional processes. One advantage in many situations may be the ability to reserve (i.e., retain, protect, etc.) a reservation material using the oxidation step without additional process steps (e.g., mask steps) or equipment that decrease throughput and/or yield. That is, the embodiment etching processes may be performed in situ (i.e., in place) in a single chamber, such as a plasma etching chamber, for example. For embodiments where the etching processes are performed as a cycle, the cyclic etching processes may be the benefit of being tunable by adjusting parameters of the oxidation step and the etch step to maximize reservation of the reservation material. One way that this may be accomplished is to adjust the parameters of the etch step so that each etch step etches some of the target material, but etches little or no reservation material (e.g., etches some or all of the oxide formed on the reservation material and does not continue into the reservation material). The etched oxide may then be replenished in an oxidation step in preparation for the next etch step.

In various embodiments, differentiation between the material compositions of the target material and the reservation material may be leveraged to allow selective oxide formation on the reservation material relative to the target material. However, a possible advantage of some embodiment etching processes is the capability of reserving a desired amount of the reservation material using an oxidation step even when the target material and the reservation material have the same or similar material composition. For example, the embodiment etching processes may advantageously use differences in etch rate caused by certain structures to enable the effective etch rate of the reservation material to be slowed more by the oxide than the effective etch rate of the target material resulting in an increase in the retention of the reservation material during the etching process.

Embodiments provided below describe various etching processes, and in particular, to systems and methods for etching processes that use in situ oxidation to increase the effective etch rate of a target material relative to a reservation material. The following description describes the embodiments. FIG. 1 is used to describe an example method of etching a target material. An example etching process is described using FIGS. 2A-2C. Another example etching process is described using FIGS. 3A and 3B. An example plasma etching system that may be used to perform the etching processes and methods is described using FIG. 4. FIGS. 5 and 6 are used to describe two more example methods of etching a target material.

FIG. 1 illustrates an example method of etching a target material using an oxidation step to slow the effective etch rate of a reservation material relative to the effective etch rate of the target material in accordance with embodiments of the invention.

Referring to FIG. 1, a method 100 of etching a target material includes an oxidation step 101 and an etch step 102, which may be repeated as part of a cycle 109 in some embodiments. During the oxidation step 101, the target material and the reservation material are exposed to an oxygen source (e.g., an oxygen source gas, such as $O_2$ gas). The exposure to the oxygen source forms oxide on the reservation material. Since both the reservation material and the target material are exposed to the oxygen source, some amount of oxide may form on the target material as well. That is, any amount of oxide may form on the target material ranging from substantially no oxide formation on the target material in some cases and the same or similar amounts of oxide formation on the target material as the reservation material in other cases.

During the etch step 102, the target material is etched using an etchant gas while the oxide on the reservation material slows the effective etch rate of the reservation material (i.e., to reserve or retain the reservation material during the etch step 102). In order for the result of the oxidation step 101 to a net increase in the reservation of the reservation material when compared to etching without an oxidation step, any oxide that forms on the target material must slow the effective etch rate of the target material less than the oxide on the reservation material slows the effective etch rate of the reservation material. Therefore, the oxide on the reservation material does not only slow the effective etch rate of the reservation material, but is configured to slow the effective etch rate of the reservation material relative to the effective etch rate of the target material.

The oxidation step 101 and the etch step 102 may be repeated any number of times as part of the cycle 109, such as when multiple etch steps are used to get to a desired endpoint of the method 100 (i.e., a desired amount of the target material is etched). For example, the oxide may be used up (i.e., etched) during the etch step 102 before the desired amount of the target material is etched, exposing the reservation material to the etchant gas and undesirably etching away reservation material if the etch step 102 is continued. In order to mitigate this possibility, some implementations of the method 100 may end each etch step 102 at or near the point when the oxide of the reservation material is removed and perform another oxidation step 101 to replenish the oxide in preparation for additional etching of the target material.

The mechanism leading to oxide formation on the reservation material may be related to the available oxygen-reactive sites (e.g., dangling bonds, weak bonds, etc.) at or near the surface of the reservation material. For this reason, it may be advantageous to begin the method 100 with an optional pre-etch step 108 in some implementations. During the optional pre-etch step 108, the reservation material and the target material may be etched using a pre-etch gas (which may or may not be the same as the etchant gas). Etching the reservation material with the pre-etch gas forms oxygen-reactive sites, which may in turn react with the oxygen source in the oxidation step 101 to form oxide. Similarly, such as during the cycle 109, each etch step 102 may form oxygen-reactive sites in the same or similar manner as the optional pre-etch step 108 advantageously aiding in oxide formation during each oxidation step 101.

During the oxidation step 101, the oxide may form selectively on the reservation material relative to the target material. The degree of selectivity may vary, ranging from no oxide being deposited on the target material to only slightly more oxide being formed on the reservation material than formed on the target material. Although other techniques may be used to achieve selective formation of oxide on the reservation material, one possible mechanism is the difference in material composition between the reservation material and the target material favors oxide formation on the reservation material. One example, might be when the reservation material is an oxide and the target material is not an oxide (or not a pure oxide). The target material is a dielectric material in some embodiments. In various embodiments, the reservation material is an oxide, and is silicon oxide in one embodiment. In contrast, the target material may not be an oxide, may be a nitride in some embodiments, and is silicon nitride in one embodiment.

In some cases, structural attributes of layers including the target material and the reservation material may influence the respective etch rates of the target material and the reservation material. One structural attribute that may impact etch rates is the aspect ratio of features on the substrate (e.g., features separated by recesses that extend down to and expose the target material and/or the reservation material) may give rise to ARD etching effects. For example, higher aspect ratio features may etch more slowly that lower aspect ratio features, even if the material being etched has the same or similar material composition. In some embodiments, the target material is exposed in a first subset of recesses that has a first aspect ratio and the reservation material is exposed in a second set of the recesses that has a second aspect ratio higher than the first aspect ratio. In one embodiment, the second aspect ratio is higher than the first aspect ratio and the first subset of recesses have the same pitch (a substantially constant pitch) as the second set of recesses (i.e., the recesses have a single pitch). In one embodiment, the reservation material in the higher aspect ratio recesses has substantially the same material composition as the target material in the lower aspect ratio recesses while the material composition of the reservation material and target material are different in another embodiment.

The method 100 may be performed by a plasma etching system that includes a source power supply configured to couple source power to a plasma, and a plasma etching chamber configured to contain the plasma. For example, both the oxidation step 101 and the etch step 102 (as well as the optional pre-etch step 108, when included) may be performed in the plasma etching chamber (i.e., the same chamber). The plasma is generated during the etch step 102 (and may be generated during the optional pre-etch step 108). In various embodiments, no plasma is generated during the oxidation step 101 (e.g., the oxidation step 101 may include exposing the substrate to the oxygen source at room temperature without plasma, at elevated temperature as a thermal oxidation step, etc.).

A substrate support may be included in the plasma etching system to support a substrate that includes the target material and the reservation material within the plasma etching chamber. Specifically, the target material and the reservation material may be exposed on the substrate (e.g., through a patterned layer, configured to be an etch mask). The plasma etching system may also include one or more valves configured to fluidically couple the oxygen source (e.g., an oxygen source gas) and an etchant gas (from which the plasma is generated) to the plasma etching chamber. A controller may be may be operatively coupled to the one or more valves and the source power supply. The controller may include a processor and a non-transitory computer-readable medium that stores a program including instructions that, when executed by the processor, perform the method 100 in situ in the plasma etching chamber.

The oxidation step 101 may also involve oxidizing other materials on the substrate. One such material might be a patterned layer that is formed over the target material, such as a mask layer configured to be an etch mask for the etch step 102. The etch mask, may be a hardmask and may be multilayer in some embodiments. The upper surfaces of features of the hardmask may be susceptible to oxidation so that oxide forms on the upper surfaces of the patterned layer during the oxidation step 101 along with the oxide formed on the reservation material. In some embodiments, the patterned layer includes a material of the same or similar material composition as the reservation material, such as an oxide (e.g., silicon oxide). When oxide is formed on upper surfaces of the patterned layer, the oxide on the upper surfaces of the patterned layer may slow the effective etch rate of the patterned layer relative to the effective etch rate of the target material during the etch step 102 (reserving mask material analogous to reserving the reservation material).

Figure 2A:
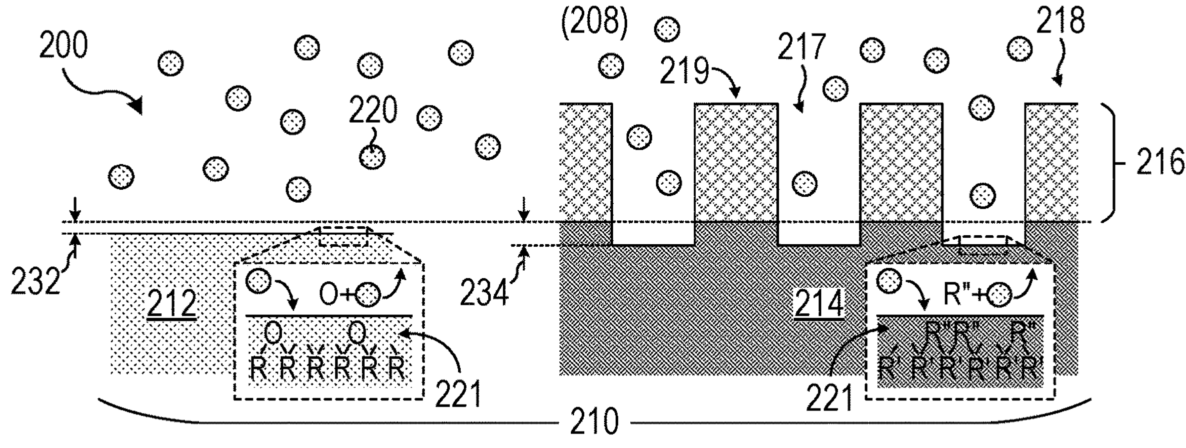
FIGS. 2A-2C illustrate an example etching process including an oxidation step and an etch step where the oxidation step selectively forms oxide on a reservation material relative to a target material, and the oxide slows the effective etch rate of the reservation material during the etch step in accordance with embodiments of the invention.
Figure 2B:
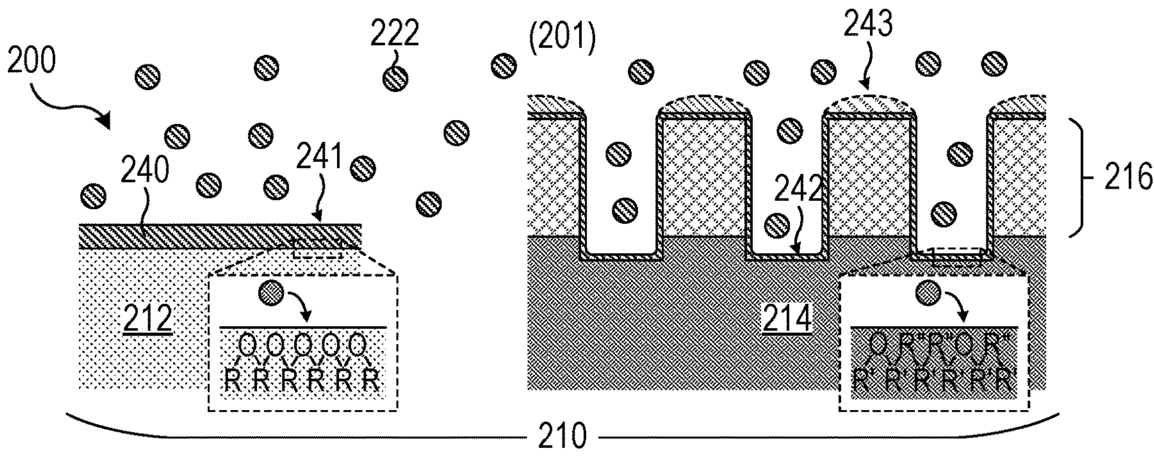
Figure 2C:
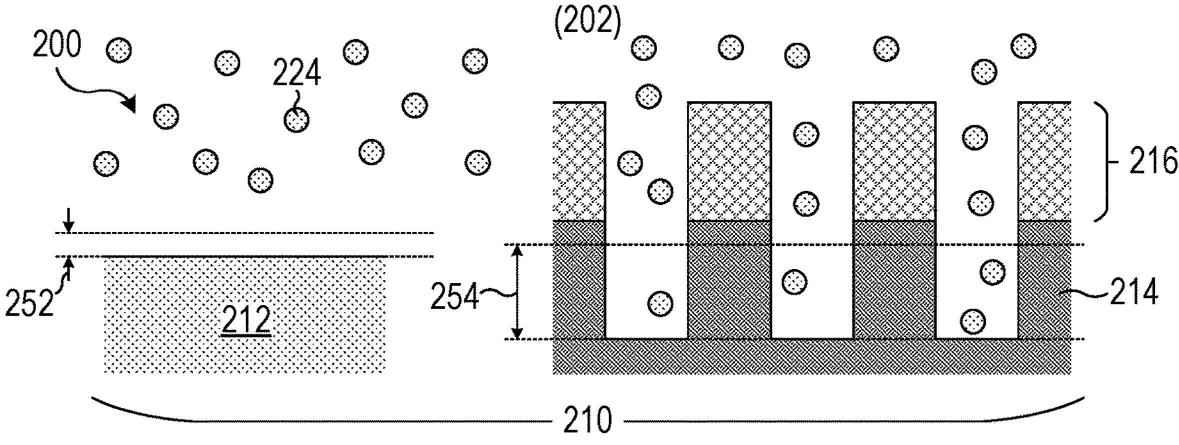

FIGS. 2A-2C illustrate an example etching process including an oxidation step and an etch step where the oxidation step selectively forms oxide on a reservation material relative to a target material, and the oxide slows the effective etch rate of the reservation material during the etch step in accordance with embodiments of the invention. The example methods of etching a target material described herein may utilize the etching process of FIGS. 2A-2C, such as the method of FIG. 1, for example. Similarly labeled elements may be as previously described.

Referring to FIG. 2A, an etching process 200 begins with a pre-etch step 208 during which a substrate 210 is exposed to a pre-etch gas 220 which etches both a reservation material 212 and a target material 214. It should be noted that here and in the following a convention has been adopted for brevity and clarity wherein elements adhering to the pattern [x08] where 'x' is the figure number may be related implementations of a pre-etch step in various embodiments. For example, the pre-etch step 208 may be similar to the optional pre-etch step 108 except as otherwise stated. That is, the etching process 200 is a specific example that includes an optional pre-etch step 108 implemented with various details specific to the etching process 200. An analogous convention has also been adopted for other elements as made clear by the use of similar terms in conjunction with the aforementioned numbering system.

The substrate 210 may be any suitable substrate, such as an insulating, conducting, or semiconducting substrate with one or more layers disposed thereon. One example category of possible substrates would be one of the many types of semiconductor wafer (silicon, silicon-on-insulator, germanium, gallium arsenide, etc.). The substrate 210 may include any manner of microelectronic devices, such as semiconductor devices. Additionally, the substrate 210 may be in an intermediate stage of fabrication to form such devices. For example, various electronic components may be included on the substrate 210 such as active components like transistors, gated diodes, and silicon-controlled rectifiers (SCRs), and passive components like resistors, capacitors, inductors, and diodes. The components may be configured to perform tasks like amplification, regulation, and signal modulation by selecting various materials, structures, and arrangements of the components. The components may be arranged in specialized circuits, some of which include memory circuits, such as random access memory (RAM), read-only memory (ROM), and flash memory, digital logic circuits including logic gates, multiplexers, decoders and encoders, flip-flops, and registers, and analog circuits such as signal processors, filters, sensors, and the like. In various embodiments, the substrate 210 is or will be an integrated circuit (IC), ranging from largescale ICs, such as a microcontroller or microprocessor, to smaller, specialized ICs.

The reservation material 212 and the target material 214 are both included in or on the substrate 210. A patterned layer 216 is disposed over the target material 214 and includes features 218 with upper surfaces 219 that are separated by recesses 217 (e.g., trenches, holes, etc.). The recesses 217 expose the target material 214 and are used as an etch mask during the pre-etch step 208. The patterned layer 216 is a hardmask in various embodiments, and is a multiplayer hardmask in some embodiments. The patterned layer 216 may include one or more dielectric materials, which may be the same or similar to the reservation material 212 and/or the target material 214. For example, in some embodiments, the patterned layer 216 includes an oxide, and is a multilayer mask that includes oxide at the upper surfaces 219 in one embodiment. The reservation material 212 may be fully exposed or a patterned layer may also overlie the reservation material 212. In some implementations the patterned layer 216 extends over and covers the reservation material 212 as well as the target material 214.

During the pre-etch step 208, the reservation material 212 is etched to a pre-etch depth 232 while the target material 214 is etch to a pre-etch depth 234. In some cases, the etch rate of the target material 214 being etched by the pre-etch gas 220 is higher than the etch rate of the reservation material 212, which results in the pre-etch depth 232 being less than the pre-etch depth 234. However, in other cases the etch depths are the same or similar.

In this specific example, the reservation material 212 and the target material 214 have different material compositions. The reservation material 212 may be a dielectric material, and may be an oxide, as shown, such as silicon oxide. For this example, the target material 214 may be any material different from the reservation material 212, and is not a pure oxide in some embodiments (e.g., a material that includes oxygen bonded to another species, but also includes at least one additional species). In various embodiments the target material 214 is a dielectric material. In some embodiments, the target material 214 is a dielectric material that does not include oxygen, and is silicon nitride (in some stoichiometric configuration, such as $Si_3N_4$) in one embodiment.

During the pre-etch step 208, bonds are broken by the pre-etch gas 220. In this specific example, oxygen bonds of the reservation material 212 are broken by the pre-etch gas 220, which bonds with the oxygen and is removed (R—O becomes R— where R may be any species, such as Si). In one embodiment, the pre-etch gas 220 includes a fluorocarbon gas and Si—O bonds of the reservation material 212 are broken by C* and F* radicals. The broken bonds create oxygen-reactive sites 221 (dangling bonds at or near the surface of the reservation material 212).

Similarly, broken bonds of the target material 214 may also form oxygen-reactive sites 221 (R'—R" becomes R'— where R' and R" may be any species, such as Si and N), but the number of the oxygen-reactive sites 221 of the target material 214 may be lower than that of the reservation material 212. This may be because the target material 214 does not have oxygen bonds and the pre-etch gas 220 forms the oxygen-reactive sites 221 mainly by breaking oxygen bonds. The number of oxygen-reactive sites 221 on the target material 214 may also be lower because the target material 214 is etched more completely and fewer dangling bonds remain after the pre-etch step 208.

Now referring to FIG. 2B, the substrate 210 is exposed to an oxygen source gas 222 (e.g., $O_2$ gas) during an oxidation step 201 to form oxide 240 on at least the reservation material 212. For example, the oxygen source gas 222 may react with the oxygen-reactive sites 221 to replenish the oxide that was lost during the pre-etch step 208 and form an oxidized reservation surface 241. The oxide 240 may also form on other surfaces, such as the target material 214 to from oxidized target surfaces 242 and/or the upper surfaces 219 to form oxidized feature surfaces 243. The difference in the material compositions of the reservation material 212 and the target material 214 may result in a more complete oxidation of the reservation material 212 relative to the target material 214. The incomplete oxidation of the oxidized target surfaces 242 may advantageously result in the target material 214 etching faster than the reservation material 212 after the oxidation step 201.

Referring to FIG. 2C, the etching process 200 continues with a etch step 202 during which the substrate 210 is exposed to an etchant gas 224 (which may be excited to form a plasma). The etchant gas 224 may be any suitable gas or mixture of gases and may be selected based on the material composition of the target material 214, the patterned layer 216, the reservation material 212, and other materials on and in the substrate 210. In one embodiment, the etchant gas 224 is the same as the pre-etch gas 220. In various embodiments, the etchant gas 224 includes a fluorine-containing species and a carbon-containing species, and includes a fluorocarbon gas in one embodiment.

The etchant gas 224 etches the oxide 240 and the target material 214. Because of the oxide 240 at the oxidized reservation surface 241, the effective etch rate of the reservation material 212 is slower than the effective etch rate of the target material 214. Specifically, the etchant gas 224 must etch through the oxidized reservation surface 241 before reaching the reservation material 212. Since the oxidized target surfaces 242 of the target material 214 are not completely oxidized, the etchant gas 224 removes the oxidized target surfaces 242 faster than the oxidized reservation surface 241 and etches the target material 214 to a target material etch depth 254.

The reservation material 212 may also be etched during the etch step 202 once the oxidized reservation surface 241 is removed (e.g., to a reservation material etch depth 252 that is still less than the target material etch depth 254), but at this point the target material 214 has already been etched for some time. In this way, the effective etch rate of the target material 214 is slowed by the oxide 240 more than the oxide 240 slows the effective etch rate of the reservation material 212. The duration of the etch step 202 may be tuned in some cases to end at or near the moment that the oxidized reservation surface 241 is removed. The oxidation step 201 and the etch step 202 may then be repeated as desired (e.g., as a cycle) until reaching the endpoint of the etching process 200 while retaining all or most of the reservation material 212.

When the oxide 240 also forms on the upper surfaces 219 of the patterned layer 216, the reservation effect may also advantageously reserve mask material during the etch step 202. For example, any additional oxide on the oxidized feature surfaces 243 will slow the effective etch rate of the patterned layer 216 and reserve mask material. In some cases, this desirable effect may be enhanced. One example may be when the oxidized feature surfaces 243 are more fully oxidized by virtue of the position of the upper surfaces 219 at the tops of the features resulting in faster oxidation than the bottom of the features where the target material 214 resides. Another example may be when the material composition of the patterned layer 216 at the upper surfaces 219 is more easily oxidizes (such as when it is the same or similar to the material composition of the reservation material 212).

Figure 3A:
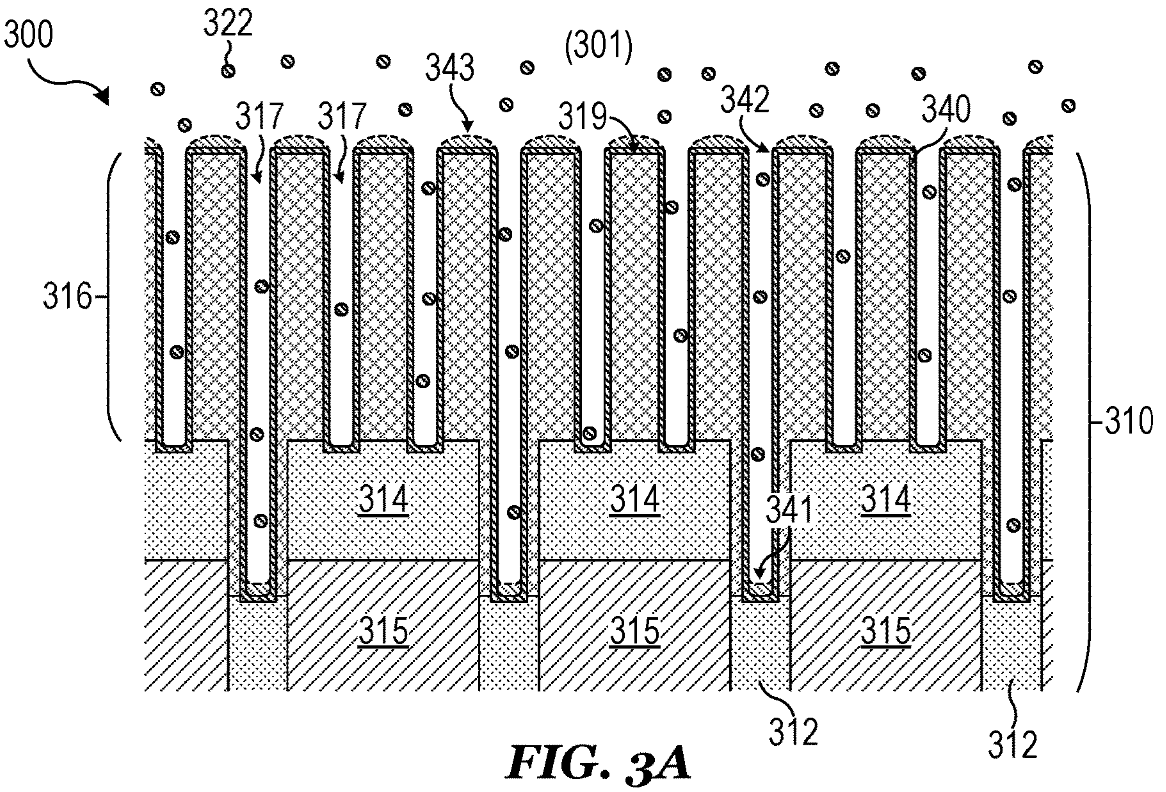
FIGS. 3A-3B illustrate another example etching process including an oxidation step and an etch step where the oxidation step forms oxide in lower aspect ratio recesses exposing a target material and in higher aspect ratio recesses exposing a reservation material, and the oxide slows the effective etch rate of the reservation material during the etch step in accordance with embodiments of the invention.
Figure 3B:
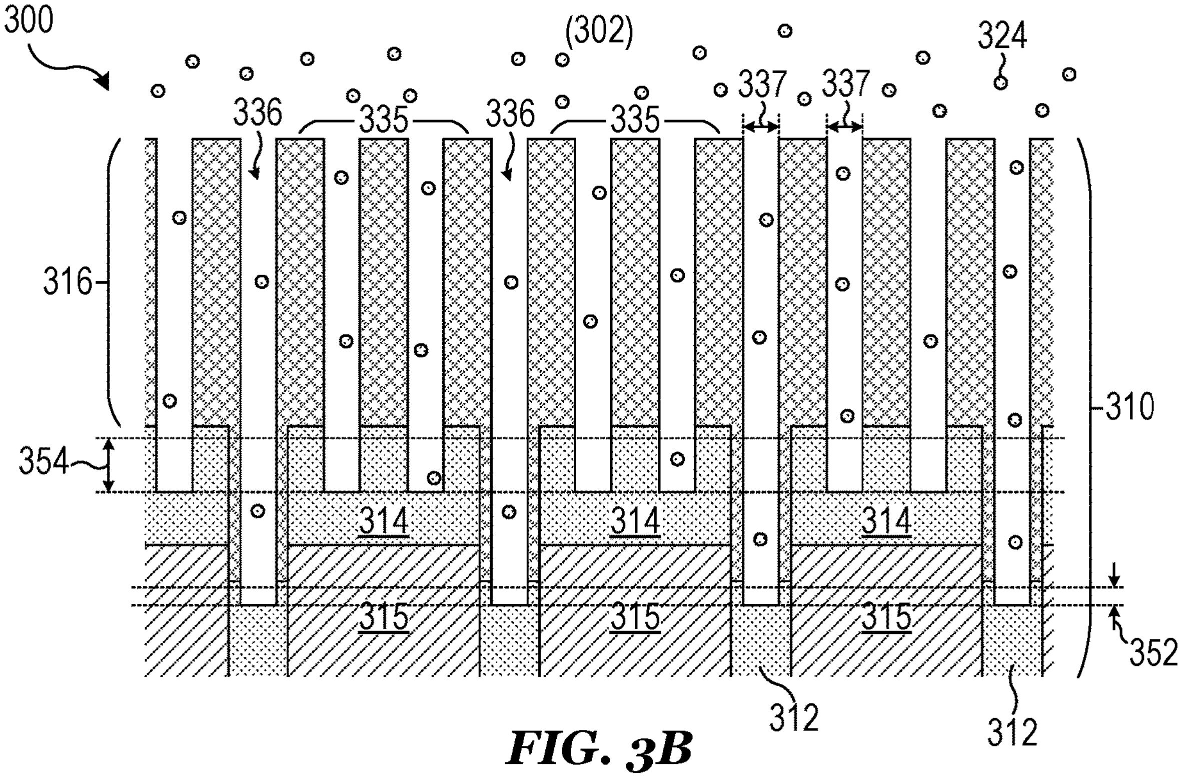

FIGS. 3A-3B illustrate another example etching process including an oxidation step and an etch step where the oxidation step forms oxide in lower aspect ratio recesses exposing a target material and in higher aspect ratio recesses exposing a reservation material, and the oxide slows the effective etch rate of the reservation material during the etch step in accordance with embodiments of the invention. The etching process of FIGS. 3A and 3B may be a specific implementation of other etching processes described herein, such as the etching process of FIGS. 2A-2C, for example. Further, the example methods of etching a target material described herein may utilize the etching process of FIGS. 3A and 3B, such as the method of FIG. 1, for example. Similarly labeled elements may be as previously described.

Referring to FIG. 3A, an etching process 300 includes an oxidation step 301 and may include previous steps, such as a pre-etch step similar to the optional pre-etch step 108, for example. During the oxidation step 301, a substrate 310 is exposed to an oxygen source gas 322 to form oxide 340 on materials of the substrate 310. The substrate 310 includes a patterned layer 316 (e.g., including a dielectric hardmask) formed on a target material 314 (e.g., a dielectric material). The target material 314 is disposed over an underlying material 315. The patterned layer 316 includes a plurality of recesses 317, some of which extend through the layer of the target material 314 and separate the target material 314 into multiple regions. Regions of the underlying material 315 beneath each region of the target material 314 are separated from one another by regions of a reservation material 312 (i.e., the reservation material 312 is laterally adjacent to the underlying material 315 in the structure of the substrate 310).

The underlying material 315 may be a device region of the substrate 310 and include a semiconductor material, such as silicon. The reservation material 312 may be an oxide and configured to electrically insulate the regions of the underlying material 315 from one another. In one embodiment, the regions of the reservation material 312 are STI (shallow trench isolation) regions. The patterned layer 316 may also include device regions in addition to material configured to be an etch mask. The regions of the target material 314 may be configured to electrically insulate device regions of the patterned layer 316 from the underlying material 315. For example, the target material 314 may be configured as a DIL (dielectric insulation layer, such as a silicon nitride insulation layer).

Similar to the etch step 202, the oxide 340 is formed on at least the reservation material 312 (which is this specific example is at the bottom of some of the recesses 317 of the patterned layer 316) forming oxidized reservation surfaces 341. The oxide 340 may also form on other surfaces, resulting in oxidized target surfaces 342 and/or oxidized feature surfaces 343.

Now turning to FIG. 3B, the etching process 300 also includes an etch step 302 during which the oxidation step 301 is exposed to an etchant gas 324. There are two types of recesses 317 in the patterned layer 316, a first subset 335 of the recesses 317 that extend down to and expose the target material 314, and a second subset 336 of the recesses 317 that extend down to and expose the reservation material 312. The target material 314 is etched by the etchant gas 324 to a target material etch depth 354 that is greater than a reservation material etch depth 352 (which may be substantially zero in some embodiments).

The structure of the materials on the substrate 310 may advantageously result in the etch rate of the target material 314 being faster than the etch rate of the reservation material 312. For example, the aspect ratio difference between the first subset 335 and the second subset 336 may result in ARD etching effects that etch the target material 314 faster. Although not strictly required, the recesses 317 may have a single pitch 337 (constant pitch) which may result in the difference in aspect ratio. The ARD etching phenomenon may also exist when etching any oxide formed on the target material 314 and the reservation material 312. For this reason, the oxide 340 may slow the effective etch rate of the reservation material 312 less than the oxide 340 slows the effect etch rate of the target material 314 even if the amount of oxide is the same or similar.

A potentially beneficial consequence of the structure-dependent etch rate differential is to enable the reservation material 312 and the target material 314 to have the same or similar material composition and still allow the reservation material 312 to be preserved during the etching process 300. However, the reservation material 312 and the target material 314 may also have different material compositions (e.g., silicon oxide and silicon nitride, respectively) and the structural etch rate differential may beneficially enhance the reservation effects of the oxide 340.

Figure 4:
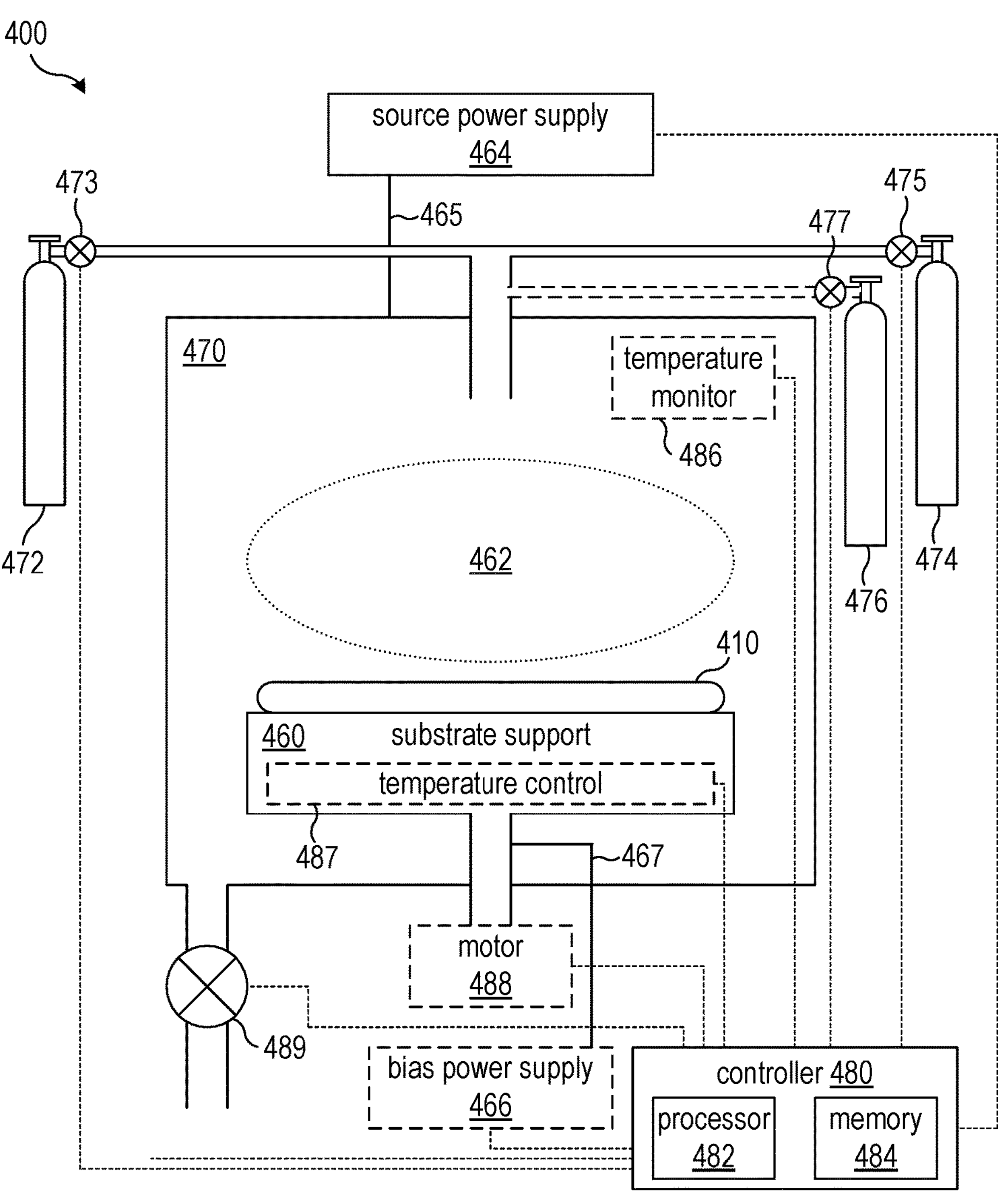
FIG. 4 illustrates an example plasma etching system that may be used to perform the etching processes and methods of etching a target material in situ in a plasma etching chamber in accordance with embodiments of the invention.
Figure 5:
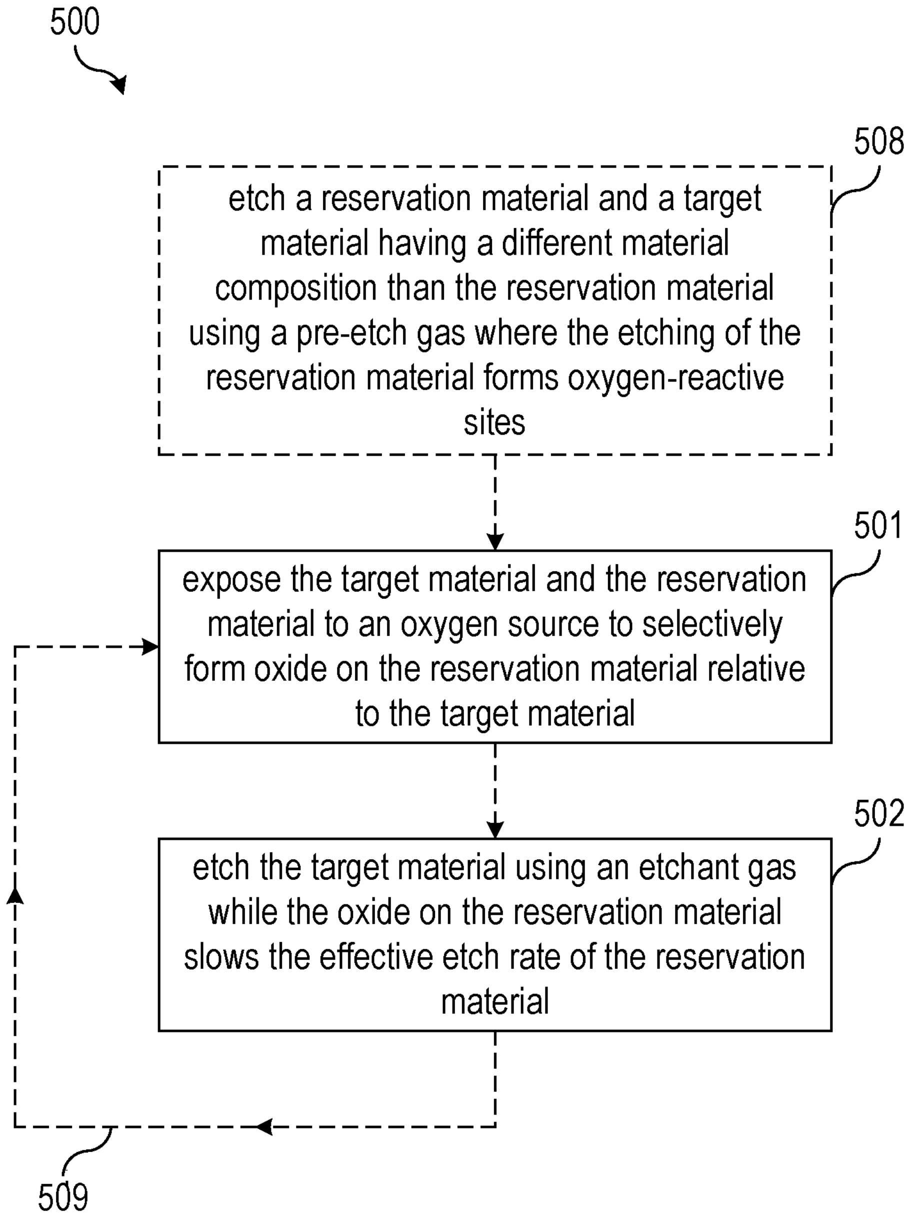
FIG. 5 illustrates an example method of etching a target material using an oxidation step to slow the effective etch rate of a reservation material that has a different material composition than the target material in accordance with embodiments of the invention.
Figure 6:
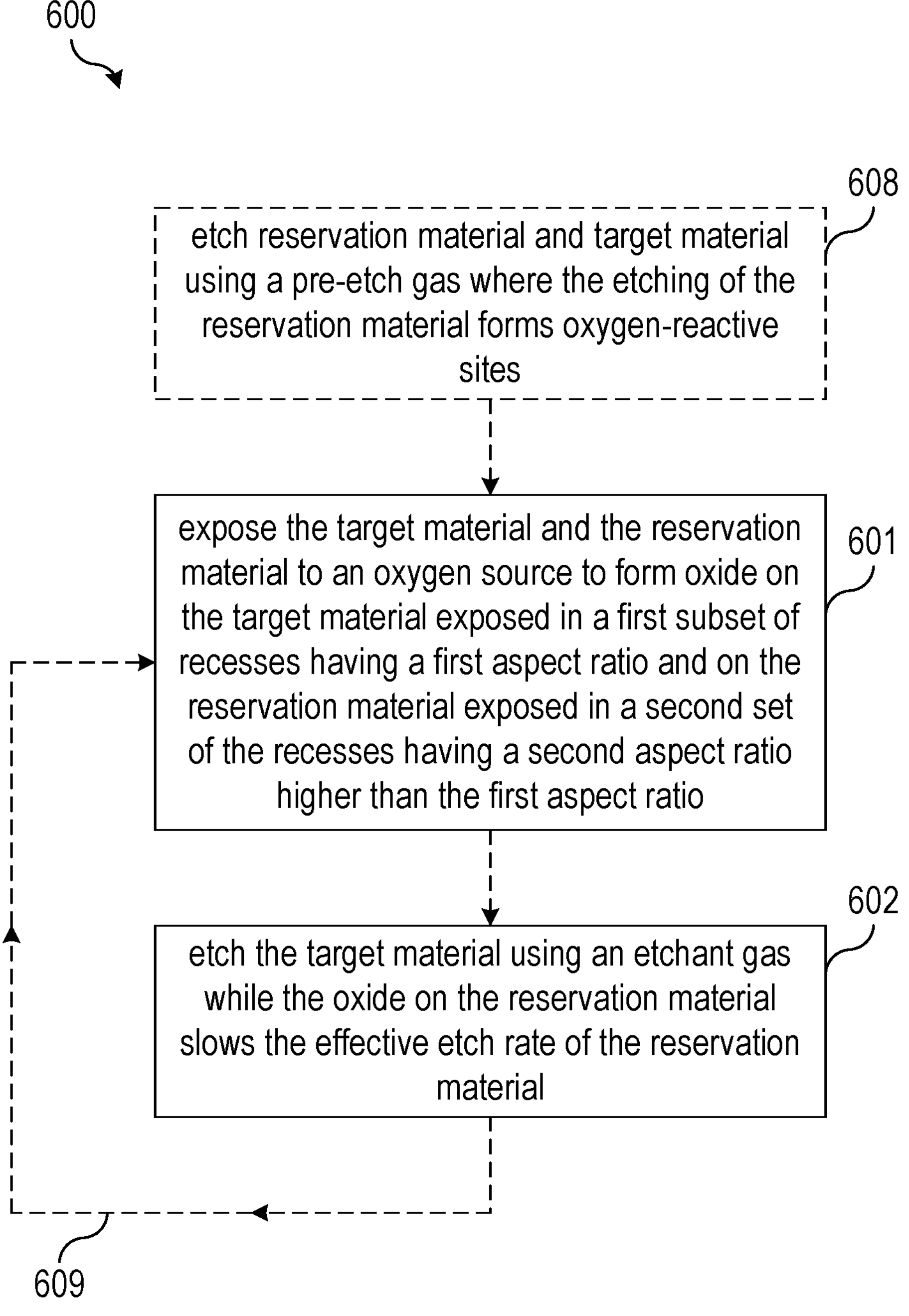
FIG. 6 illustrates an example method of etching a target material using oxidation step to slow the effective etch rate of a reservation material that is exposed by recesses with a higher aspect ratio than recesses that expose the target material in accordance with embodiments of the invention.

FIG. 4 illustrates an example plasma etching system that may be used to perform the etching processes described herein, such as the etching processes of FIGS. 2A-2C, 3A, and 3B, and the methods of etching a target material also described herein, such as the methods of FIGS. 1, 5, and 5, in situ in a plasma etching chamber in accordance with embodiments of the invention. Similarly labeled elements may be as previously described.

Referring to FIG. 4, a plasma etching system 400 includes a substrate support 460 disposed within a plasma etching chamber 470 and configured to support a substrate 410. An oxygen source 472 (e.g., a gas source or sources that include oxygen that is available to oxidize a desired reservation material), an etchant source 474 (e.g., a gas source or sources including one or more reactive gases configured to etch a desired target material) are fluidically coupled to the plasma etching chamber 470 through one or more valves, such as an oxygen valve 473 and an etchant valve 475. Additional gas sources and valves may also be included in the plasma etching system 400. For example, an optional additional gas source 476 (e.g., a gas source or sources including additional gases, which may be any type of gas, such as carrier gases, additional reactants and precursors, stabilizers, catalysts and others) may be fluidically coupled to the plasma etching chamber 470 through an optional additional gas valve 477. An exhaust valve 489 is also included to evacuate the plasma etching chamber 470 during the processes performed therein, such as the etching processes as described in the foregoing, additional processes preceding or following the etching processes, and others.

The plasma etching chamber 470 may be any suitable etch chamber and may also be usable for other processes such as deposition. In various embodiments, process steps of an etching process performed by the plasma etching system 400 (e.g., an oxidation step) may be performed without generating plasma. In other cases, plasma may be generated during some or all of the process steps in addition to during the plasma etch steps. The plasma etching chamber 470 may be used for some or all of the process steps of an etching process. In various embodiments, an oxidation step to slow the effective etch rate of a reservation material relative to the effective etch rate of a target material and an etch step of etching the target material are performed in situ in the plasma etching chamber 470 (i.e., in place in the same chamber). In one embodiment, pre-etch step is also performed in situ in the plasma etching chamber 470 along with the oxidation step and the etch step. In some embodiments, the oxidation step and the etch step are repeated as part of a cycle performed in situ in the plasma etching chamber 470, and a pre-etch step is also performed in situ along the cycle in one embodiment.

The plasma etching system 400 is configured to generate a plasma 462 during at least some etch steps, but the plasma 462 may also be generated during oxidation steps in some embodiments. A source power supply 464 is configured to couple source power 465 to the plasma etching chamber 470 in order to generate the plasma 462. The plasma etching chamber 470 may be any suitable etching chamber, such as a capacitively coupled plasma (CCP) etching chamber, an inductively coupled plasma (ICP) etching chamber, etc. A bias power supply 466 may also be included that is configured to supply bias power 467 to the substrate support 460 (and the substrate 410), such as to accelerate ions in the plasma 462 towards the substrate 410, for example.

An optional temperature monitor 486 may also be included to monitor and/or aid in controlling the temperature of the substrate 410 and the environment in the plasma etching chamber 470. An optional temperature control device 487 (heater, cooler, or combination thereof) may be included to elevate or reduce the temperature of the substrate 410 above/below the equilibrium temperature at the substrate 410 during the process steps (although some process steps may be performed at ambient temperatures). An optional motor 488 may also be included to improve etch/deposition uniformity.

A controller 480 is operatively coupled to the one or more valves (the oxygen valve 473, the etchant valve 475, the optional additional gas valve 477, etc.) and the source power supply 464, and may be operatively coupled to any of the bias power supply 466, the optional temperature monitor 486, the optional temperature control device 487, the optional motor 488, and the exhaust valve 489. The controller 480 includes a processor 482 and a memory 484 (i.e., a non-transitory computer-readable medium) that stores a program including instructions that, when executed by the processor 482, perform processes such as the etching processes described herein. For example, the memory 484 may have volatile memory (e.g., random access memory (RAM)) and non-volatile memory (e.g., flash memory). Alternatively, the program may be stored in physical memory at a remote location, such as in cloud storage. The processor 482 may be any suitable processor, such as the processor of a microcontroller, a general-purpose processor (such as a central processing unit (CPU), a microprocessor, a field-programmable gate array (FPGA), an application-specific integrated circuit (ASIC), and others.

FIG. 5 illustrates an example method of etching a target material using an oxidation step to slow the effective etch rate of a reservation material that has a different material composition than the target material in accordance with embodiments of the invention. The method of FIG. 5 may be combined with other methods, utilize various processes, and be performed using the systems and apparatuses as described herein. For example, the method of FIG. 5 may be combined with any of the embodiments of FIGS. 1-4 and 6. Although shown in a logical order, the arrangement and numbering of the steps of FIG. 5 are not intended to be limited. The method steps of FIG. 5 may be performed in any suitable order or concurrently with one another as may be apparent to a person of skill in the art.

Referring to FIG. 5, a method 500 of etching a target material includes an oxidation step 501 of exposing the target material and a reservation material to an oxygen source to selectively form oxide on the reservation material relative to the target material. Specifically, the reservation material has a different material composition than the target material. The target material is then etched in a etch step 502 using an etchant gas. During the etch step 502, the oxide on the reservation material slows the effective etch rate of the reservation material relative to the effective etch rate of the target material. For example, both the target material and the reservation material may be etched during the etch step 502 and the oxide reduces the total amount of the reservation material etched during the etch step 502 more than the oxide reduces the total amount of the target material etched during the etch step 502. If desired, such as to increase the etch depth of the target material to a desired endpoint while reserving a desired thickness of the reservation material, the oxidation step 501 and the etch step 502 may be repeated as part of a cycle 509.

An optional pre-etch step 508 may be included in the method 500 before the oxidation step 501. During the optional pre-etch step 508, the reservation material and the target material are etched using a pre-etch gas (which may or may not be the same as the etchant gas). The etching of the reservation material forms oxygen-reactive sites (e.g., dangling bonds of a component of the reservation material that readily bond with oxygen from the oxygen source to locally form oxide).

FIG. 6 illustrates an example method of etching a target material using oxidation step to slow the effective etch rate of a reservation material that is exposed by recesses with a higher aspect ratio than recesses that expose the target material in accordance with embodiments of the invention. The method of FIG. 6 may be combined with other methods, utilize various processes, and be performed using the systems and apparatuses as described herein. For example, the method of FIG. 6 may be combined with any of the embodiments of FIGS. 1-5. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, a method 600 of etching a target material includes an oxidation step 601 of exposing the target material and a reservation material to an oxygen source to form oxide on the target material exposed in a first subset of recesses (e.g., trenches) having a first aspect ratio and on the reservation material exposed in a second set of the recesses (e.g., trenches) having a second aspect ratio higher than the first aspect ratio. The target material and the reservation material may have the same material composition or may have different material compositions. The target material is then etched in a etch step 602 using an etchant gas.

During the etch step 602, the oxide on the reservation material slows the effective etch rate of the reservation material relative to the effective etch rate of the target material. For example, both the target material and the reservation material may be etched during the etch step 602 at etch rates that are aspect ratio dependent. That is, without the oxide, more of the target material may be etched by the etchant in a given time period than the reservation material due to the higher aspect ratio of the second set of recesses. Meanwhile, the same may be true for the etch rate of the oxide formed on the target material and the reservation material. Therefore, adding an equal amount of oxide to both the target material and the reservation material may reduce the total amount of the reservation material etched during the etch step 602 more than the oxide reduces the total amount of the target material etched during the etch step 602. If desired, such as to increase the etch depth of the target material to a desired endpoint while reserving a desired thickness of the reservation material, the oxidation step 601 and the etch step 602 may be repeated as part of a cycle 609.

An optional pre-etch step 608 may be included in the method 600 before the oxidation step 601. During the optional pre-etch step 608, the reservation material and the target material are etched using a pre-etch gas (which may or may not be the same as the etchant gas). The etching of the reservation material forms oxygen-reactive sites (e.g., dangling bonds of a component of the reservation material that readily bond with oxygen from the oxygen source to locally form oxide).

Example embodiments of the invention are summarized here. Other embodiments can also be understood from the entirety of the specification as well as the claims filed herein.

Example 1. A method of etching a target material exposed on a substrate that also includes a reservation material exposed on the substrate, the method including: exposing both the target material and the reservation material to an oxygen source to selectively form oxide on the reservation material relative to the target material, the reservation material having a different material composition than the target material; and etching the target material using an etchant gas, the oxide on the reservation material slowing an effective etch rate of the reservation material relative to an effective etch rate of the target material.

Example 2. The method of example 1, further including: etching both the reservation material and the target material using a pre-etch gas, the etching of the reservation material forming oxygen-reactive sites.

Example 3. The method of one of examples 1 and 2, further including: repeating the oxidizing of both the target material and the reservation material, and the etching of the target material as part of a cycle.

Example 4. The method of one of examples 1 to 3, where oxidizing both the target material and the reservation material further includes oxidizing a patterned layer formed over the target material to form oxide on upper surfaces of the patterned layer, and where etching the target material further includes using the patterned layer as an etch mask, the oxide on the upper surfaces of the patterned layer slowing an effective etch rate of the patterned layer relative to the effective etch rate of the target material.

Example 5. The method of example 4, where the upper surfaces of the patterned layer have the same material composition as the reservation material.

Example 6. The method of one of examples 1 to 5, where etching the target material includes applying source power to generate a plasma from the etchant gas.

Example 7. The method of one of examples 1 to 6, where the reservation material is an oxide and the target material is a dielectric.

Example 8. The method of example 7, where the oxide of the reservation material is silicon oxide configured as a shallow trench isolation of the substrate, and where the dielectric of the target material is silicon nitride configured as an insulating layer disposed higher on the substrate than the shallow trench isolation.

Example 9. The method of example 8, where etching the target material includes using a patterned layer formed over both the insulating layer and the shallow trench isolation as an etch mask, the patterned layer including recesses with a single pitch, where the insulating layer is disposed above an underlying material, the shallow trench isolation being formed laterally adjacent to the underlying material, where a first subset of the recesses exposes the target material, and where a second subset of the recesses exposes the reservation material.

Example 10. A method of etching a target material exposed on a substrate that also includes a reservation material exposed on the substrate, the method including: exposing both the target material and the reservation material to an oxygen source to form oxide both on the target material exposed in a first subset of recesses having a first aspect ratio and on the reservation material exposed in a second set of the recesses having a second aspect ratio higher than the first aspect ratio; and etching the target material using an etchant gas, the oxide slowing an effective etch rate of the reservation material relative to an effective etch rate of the target material.

Example 11. The method of example 10, further including: etching both the reservation material and the target material using a pre-etch gas, the etching of the reservation material forming oxygen-reactive sites.

Example 12. The method of one of examples 10 and 11, further including: repeating the oxidizing of both the target material and the reservation material, and the etching of the target material as part of a cycle.

Example 13. The method of one of examples 10 to 12, where oxidizing both the target material and the reservation material further includes oxidizing a patterned layer including the recesses to form oxide on upper surfaces of the patterned layer, and where etching the target material further includes using the patterned layer as an etch mask, the oxide on the upper surfaces of the patterned layer slowing an effective etch rate of the patterned layer relative to the effective etch rate of the target material.

Example 14. The method of one of examples 10 to 13, where the recesses have a single pitch.

Example 15. The method of one of examples 10 to 14, where the target material has substantially the same material composition as the reservation material.

Example 16. The method of one of examples 10 to 14, where the target material has a different material composition than the reservation material.

Example 17. A plasma etching system including: a plasma etching chamber configured to contain a plasma; a substrate support configured to support a substrate within the plasma etching chamber, the substrate including a target material and a reservation material, both exposed on the substrate; one or more valves configured to fluidically couple an oxygen source gas and an etchant gas to the plasma etching chamber; a source power supply configured to couple source power to the plasma; and a controller operatively coupled to the one or more valves and the source power supply, the controller including a processor and a non-transitory computer-readable medium storing a program including instructions that, when executed by the processor, perform a method in situ in the plasma etching chamber, the method including: exposing both the target material and the reservation material to the oxygen source gas to selectively form oxide on the reservation material relative to the target material; and etching the target material using the etchant gas by applying the source power to generate the plasma, the oxide on the reservation material slowing an effective etch rate of the reservation material relative to an effective etch rate of the target material.

Example 18. The plasma etching system of example 17, where the method further includes: etching both the reservation material and the target material using a pre-etch gas, the etching of the reservation material forming oxygen-reactive sites.

Example 19. The plasma etching system of one of examples 17 and 18, where the method further includes: repeating the oxidizing of both the target material and the reservation material, and the etching of the target material as part of a cycle.

Example 20. The plasma etching system of one of examples 17 to 19, where no plasma is generated during the oxidizing of both the target material and the reservation material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a target material exposed on a substrate that also comprises a reservation material exposed on the substrate, the method comprising:

exposing both the target material and the reservation material to an oxygen source to selectively form an oxide on the reservation material relative to the target material, the reservation material having a different material composition than the target material; and etching the target material using an etchant gas, the oxide on the reservation material slowing an effective etch rate of the reservation material relative to an effective etch rate of the target material.

2. The method of claim 1, further comprising:

etching both the reservation material and the target material using a pre-etch gas, the etching of the reservation material forming oxygen-reactive sites.

3. The method of claim 1, further comprising:

repeating the exposing of both the target material and the reservation material, and the etching of the target material as part of a cycle.

4. The method of claim 1, wherein oxidizing both the target material and the reservation material further comprises oxidizing a patterned layer formed over the target material to form oxide on upper surfaces of the patterned layer, and wherein etching the target material further comprises using the patterned layer as an etch mask, the oxide on the upper surfaces of the patterned layer slowing an effective etch rate of the patterned layer relative to the effective etch rate of the target material.

5. The method of claim 4, wherein the upper surfaces of the patterned layer have the same material composition as the reservation material.

6. The method of claim 1, wherein etching the target material comprises applying source power to generate a plasma from the etchant gas.

7. The method of claim 1, wherein the reservation material is an oxide and the target material is a dielectric.

8. The method of claim 7, wherein the oxide of the reservation material is silicon oxide configured as a shallow trench isolation of the substrate, and wherein the dielectric of the target material is silicon nitride configured as an insulating layer disposed higher on the substrate than the shallow trench isolation.

9. The method of claim 8, wherein etching the target material comprises using a patterned layer formed over both the insulating layer and the shallow trench isolation as an etch mask, the patterned layer comprising recesses with a single pitch, wherein the insulating layer is disposed above an underlying material, the shallow trench isolation being formed laterally adjacent to the underlying material, wherein a first subset of the recesses exposes the target material, and wherein a second subset of the recesses exposes the reservation material.

10. A method of etching a target material exposed on a substrate that also comprises a reservation material exposed on the substrate, the method comprising:

exposing both the target material and the reservation material to an oxygen source to form an oxide both on the target material exposed in a first subset of recesses having a first aspect ratio and on the reservation material exposed in a second set of the recesses having a second aspect ratio higher than the first aspect ratio; and etching the target material using an etchant gas, the oxide slowing an effective etch rate of the reservation material relative to an effective etch rate of the target material.

11. The method of claim 10, further comprising:

etching both the reservation material and the target material using a pre-etch gas, the etching of the reservation material forming oxygen-reactive sites.

12. The method of claim 10, further comprising:

repeating the exposing of both the target material and the reservation material, and the etching of the target material as part of a cycle.

13. The method of claim 10, wherein oxidizing both the target material and the reservation material further comprises oxidizing a patterned layer comprising the recesses to form oxide on upper surfaces of the patterned layer, and wherein etching the target material further comprises using the patterned layer as an etch mask, the oxide on the upper surfaces of the patterned layer slowing an effective etch rate of the patterned layer relative to the effective etch rate of the target material.

14. The method of claim 10, wherein the recesses have a single pitch.

15. The method of claim 10, wherein the target material has substantially the same material composition as the reservation material.

16. The method of claim 10, wherein the target material has a different material composition than the reservation material.

* * * * *